United States Patent
Erb

Patent Number: 6,107,186
Date of Patent: Aug. 22, 2000

[54] HIGH PLANARITY HIGH-DENSITY IN-LAID METALLIZATION PATTERNS BY DAMASCENE-CMP PROCESSING

[75] Inventor: Darrell M. Erb, Los Altos, Calif.

[73] Assignee: Advanced Micro Devices, Inc., Sunnyvale, Calif.

[21] Appl. No.: 09/238,051

[22] Filed: Jan. 27, 1999

[51] Int. Cl.$^7$ .............................................. H01L 21/4763
[52] U.S. Cl. .................... 438/633; 438/687; 438/692; 427/98; 427/99; 427/250; 427/430.1; 427/443.1; 205/95; 205/103; 205/104; 205/118; 205/123; 205/125
[58] Field of Search ............................. 205/95, 123, 103, 205/104, 118, 125; 438/692, 633, 687; 216/88; 427/98, 99, 250, 430.1, 443.1

[56] References Cited

U.S. PATENT DOCUMENTS

| | | | |
|---|---|---|---|
| 4,789,648 | 12/1988 | Chow et al. | 437/225 |
| 5,503,882 | 4/1996 | Dawson | 427/579 |
| 5,928,960 | 7/1999 | Greco et al. | 438/692 |

*Primary Examiner*—Kathryn Gorgos
*Assistant Examiner*—Christopher M. Keehan

[57] ABSTRACT

Erosion of high density metallization areas associated with conventional damascene-CMP processing is avoided and greater planarity achieved by selectively increasing the metal overburden layer thickness at high density metallization regions. Embodiments include initially filling recesses formed in the substrate surface with a metal forming a blanket or overburden layer of the metal thereon. Regions of the blanket or overburden layer overlying regions of high density metallization are selectively electroplated to a greater thickness. The surface is then planarized by CMP, with the selectively increased thickness areas of the overburden layer compensating for greater erosion rates thereat during CMP, thereby resulting in greater planarity of the polished surface.

19 Claims, 3 Drawing Sheets

6,107,186

HIGH PLANARITY HIGH-DENSITY IN-LAID METALLIZATION PATTERNS BY DAMASCENE-CMP PROCESSING

FIELD OF THE INVENTION

The present invention relates to a method for forming a layer of an electrically conductive material filling a plurality of closely spaced apart recesses forming a high-density pattern in the surface of a substrate, wherein the exposed upper surface of the layer is substantially co-planar with non-recessed areas of the substrate surface. More particularly, the invention relates to a method for forming high-density "back-end" metallization of semiconductor integrated circuit devices which facilitates planarization by chemical-mechanical polishing (CMP), increases manufacturing throughput, and improves product quality.

BACKGROUND OF THE INVENTION

This invention relates to a method for forming metal films as part of high-density metallization processing of particular utility in integrated circuit semiconductor device and circuit board manufacture, which process employs "damascene" (or "in-laid") technology.

Metal films of the type contemplated herein are used, e.g., in "back-end" semiconductor manufacturing technology, to form electrically conductive contacts to active as well as passive device regions or components formed in or on a semiconductor substrate, as well as for filling via holes, interlevel metallization, and interconnection routing patterns for wiring together the components and/or regions. Metals employed for such purposes include, inter alia, titanium, tantalum, tungsten, aluminum, chromium, nickel, cobalt, silver, gold, copper, and their alloys. Of these, copper and copper-based alloys are particularly attractive for use in large-scale integration (LSI), very large-scale integration (VLSI), and ultra large-scale integration (ULSI) semiconductor devices requiring multilevel metallization systems for "back-end" processing of the semiconductor wafers on which the devices are based. Copper and copper-based metallization systems have very low resistivities, i.e., lower than those of previously preferred systems utilizing aluminum and its alloys, as well as significantly higher resistance to electromigration. Moreover, copper and its alloys enjoy a considerable cost advantage over a number of the above-enumerated metals, notably silver and gold. Also, in contrast to aluminum and the refractory-type metals included in the above listing, copper and its alloys can be readily deposited in good quality, bright layer form by well-known electroplating techniques, at deposition rates fully compatible with the requirements of device manufacturing throughput.

Referring now to FIG. 1, schematically shown therein in cross-sectional view is a conventional damascene processing sequence for forming recessed (i.e., "in-laid") metallization patterns such as, for example, "back-end" contacts, vias, interconnections, routing, etc., in a semiconductor device formed in or on a semiconductor wafer substrate 1. In a first step, the desired conductor pattern is defined as a pattern of recesses 2 such as grooves, trenches, holes, etc., formed (e.g., by etching) in the surface 4 of a dielectric layer 3 deposited or otherwise formed over the semiconductor substrate, followed by a second step comprising deposition of a suitably conductive metal layer 5 filling the etched recesses 2. Typically, in order to ensure complete filling of the recesses, the metal layer 5 is deposited as a blanket (or "overburden") layer of excess thickness t so as to overfill the recesses 2 and cover the exposed upper surface of the dielectric layer 3. Next, the entire excess thickness t of the metal overburden layer 5 over the surface of the dielectric layer 3 is removed using a chemical-mechanical polishing (CMP) process comprising moving the wafer while urging the wafer surface into contact with a facing surface of a polishing pad and providing a slurry comprising abrasive particles in the area of contact. As a result of such polishing, the portions of the overburden layer 5 overlying the surface 4 of the dielectric layer 3 are substantially completely removed, while metal portions 5' remain in the recesses 2 with their exposed upper surfaces 6 substantially co-planar with the surface 4 of the dielectric layer 3. Thus this conventional process, termed "damascene process" forms in-laid conductors 5' in the dielectric layer while avoiding problems associated with other types of processes, e.g., metal etching and dielectric gap filling.

Such damascene processing as described above can be performed with a variety of other types of substrates, e.g., printed circuit boards, with and/or without intervening dielectric layers, with a plurality of metallization levels (i.e., up to five at present), and with any of the previously enumerated metals. However, the parallel drives toward cost reduction and increased microminiaturization of semiconductor devices have provided impetus for greater utilization of copper or copper-based metallization/interconnection metallurgy, particularly in view of the above-described advantages obtainable thereby. The use of copper-based metallurgy, however, has presented several problems and drawbacks, including the possibility of copper diffusion into the semiconductor substrate (typically silicon) and poor adhesion to various dielectric materials (typically oxides and/or nitrides of silicon), necessitating provision of an adhesion promoting and/or diffusion barrier layer (e.g., of chromium, tantalum, or tantalum nitride) prior to deposition of copper-based metallization.

Another problem associated with damascene processing of metallic materials, including copper and its alloys, arises from the phenomenon of increased rates of erosion by CMP of high-density conductor patterns, i.e., patterns wherein the surface coverage by the layer of electrically conductive material forming the pattern is above about 80% of the available surface area, e.g., 80–90% coverage as is typical in current semiconductor technology. As will be described in more detail below, such increased erosion rates of regions of high density metallization patterns by CMP, vis-à-vis erosion rates of regions of lower metallization density or which are free of metallization, also results in greater erosion of the dielectric layer portions intermediate the metallization features. As a consequence, non-planarity occurs across the surface of a wafer substrate in at least rough correspondence to the pattern of high and low density metallization regions.

The above-described phenomenon will now be described in more detail with reference to FIGS. 2–3, which are simplified schematic-cross-sectional "before CMP" and "after CMP" views, respectively, of a portion of an intermediate device structure 10 subjected to damascene processing for forming an in-laid metallization pattern therein, and in which like reference numerals are used as previously to designate like features.

More particularly, as shown in the "before CMP" view of FIG. 2, a typical intermediate structure 10 prepared for damascene type "back-end" metallization processing may include a plurality of types of surface regions, designated, for illustrative purposes only, as regions A, B, and C of a substrate comprising a semiconductor wafer 1. For descriptive purposes, a region hereinafter characterized as a "relatively high-density region" denotes a region wherein a metallization pattern occupies more than 80% of the available surface area of the region, e.g., 80–90% of the available surface area. As a corollary, a region which comprises a metallization pattern occupying less than about 80% of the available surface area is denoted as a "relatively low-density" region. A region which contains substantially no recesses is designated as "recess-free".

As illustrated in FIG. 2, a relatively low recess density first type region A of intermediate structure 10 comprises a single recess 2 extending for a depth into dielectric layer 3. A relatively high recess density second type region B comprises a plurality of relatively closely-spaced recesses 2 extending for a similar depth into dielectric layer 3 and may, for example, form part of an interconnection or routing pattern or circuit. Substantially recess-free third type region C is not subjected to metallization patterning.

Intermediate structure 10, prepared by conventional technology such as has been previously described with reference to FIG. 1, comprises dielectric and metal overburden layers, 3 and 5, respectively, of substantially uniform thickness across the surface area of semiconductor wafer substrate 1. That is, dielectric layer thicknesses $d_1$, $d_2$, and $d_3$, of respective first, second, and third type regions A, B, and C, are substantially equal, as are the corresponding metal overburden layer thicknesses $t_1$, $t_2$, and $t_3$. The required, or design, thickness of the planarized metallization segments or portions 5' filling the recesses 2' of the second type region B is designated by reference letter m.

When fabricated according to the design requirements of current semiconductor device technology, the relatively high recess density second type region B of intermediate structure 10 comprises a large plurality of recesses 2', limited to four in the drawing for illustrative simplicity, spaced apart by about 0.18–0.5 $\mu$m and having widths and depths of about 0.8–2.0 $\mu$m and 0.3–2.5 $\mu$m, respectively. Metal overburden layer 5 may have a thickness of about 1.5 $\mu$m and dielectric layer may have a thickness of about 0.3–1.0 $\mu$m, depending upon the particular dielectric material and device design requirements.

Referring now to FIG. 3, shown therein is a cross-sectional schematic view of the same portion of intermediate structure 10 as in FIG. 2, but after removal of metal overburden layer 5 according to conventional chemical-mechanical polishing (CMP) technology in order to form in-laid conductor segments or portions 5'. As is apparent from the figure, because of the previously noted phenomenon associated with CMP of high density metal segments, a greater thickness of metal overburden layer 5 has been eroded in the relatively high recess density second type region B than in the relatively low recess density first type region A and the substantially recess-free third type region C.

As a consequence of the increased erosion of the metal overburden layer 5 in the relatively high recess density second type region B, the portions of the dielectric layer 3 filling the spaces between adjacent recesses 2' of the region are also subjected to increased erosion relative to the portions of dielectric layer 3 of the first and third type regions A and C, respectively. Thus, whereas the dielectric layer 3 thicknesses $d_1$ and $d_3$ of first and third type regions A and B, respectively, are unaffected by the CMP processing, both thickness $d_2$, of dielectric layer 3 and thickness m' of the planarized metallization segments or portions 5' are reduced during the CMP processing. The effect of increased erosion of both components of region B is non-planarity of the overall polished surface due to formation therein of a concavity 11 of average depth $d_4$ below the surface 4 of the dielectric layer 3 in regions A and C.

In general, the depth $d_4$ of concavity 11 will depend upon a number of factors, including the particular metallization metal, its density in region B, and the CMP conditions, such as pad hardness, applied pressure, type of abrasive particles, slurry additives, etc., and must be determined for each particular application.

The formation of concavity 11 incurs a further consequence arising from the reduction of the thickness of the metal layer portions of the metallization segments 5', i.e., lower conductivity metallization patterns, often less than design or minimum acceptable values. Moreover, the concomitantly reduced thickness of the dielectric layer 3 adversely affects interlevel isolation, and can result in other deleterious effects such as crosstalk and RC time constant signal delay. In addition, and very significantly, the negative effects of such non-planarity are exacerbated in multi-level metallization schemes such as are required for LSI, VLSI, and ULSI devices.

Thus, there exists a need for a method for forming high-density in-laid metallization patterns by a damascene-CMP technique which does not suffer from the problems and drawbacks of the prior art, i.e., non-planarity, reduced electrical conductivity of the metallization features, and reduced dielectric isolation resulting in degradation of device properties. Specifically, there exists a need for an improved electroplating and CMP-based metallization method for forming, by damascene techniques, high-density, in-laid, copper-based "back-end" contacts, vias, interlevel metallization, and interconnect routing of active devices (e.g., transistors) and/or other components in integrated circuit semiconductor devices. Moreover, there exists a need for an improved electroplating and CMP-based method which is fully compatible with conventional process flow, methodology, and throughput requirements in the manufacture of such integrated circuit semiconductor devices and other devices requiring in-laid metallization patterns.

DISCLOSURE OF THE INVENTION

An advantage of the present invention is a method of manufacturing a device with a highdensity in-laid metallization pattern with greater planarity than obtainable with conventional process methodology.

Another advantage of the present invention is a method of manufacturing an integrated circuit semiconductor device utilizing high-density "back-end" contacts and interconnections by a damascene-CMP process, with greater uniformity and planarity.

Still another advantage of the present invention is a method for forming high-density in-laid contacts and metallization patterns in a dielectric layer, without reduction in conductivity and dielectric isolation properties.

A further advantage of the present invention is an improved method for forming high-density in-laid contacts and metallization patterns by a damascene-type electroplating and CMP-based process which is fully compatible with existing process methodology for forming integrated circuit semiconductor devices and circuit boards.

A still further advantage of the present invention is a semiconductor device having an improved planarity high-density in-laid "back-end" metallization pattern formed in a dielectric layer overlying a semiconductor wafer substrate.

Additional advantages and other features of the present invention will be set forth in the description which follows and in part will become apparent to those having ordinary skill in the art upon examination of the following or will be learned from the practice of the invention. The advantages of the present invention may be realized and obtained as particularly pointed out in the appended claims.

According to one aspect of the present invention, the foregoing and other advantages are achieved in part by a method of forming a layer of an electrically conductive material filling a plurality of closely spaced apart recesses formed in a substrate surface, the layer having an exposed upper surface substantially coplanar with the substrate surface, the method comprising the sequential steps of:

providing a substrate having a surface comprising:
a first type region having a relatively high density of closely spaced apart recesses formed therein with non-recessed areas therebetween; and at least one of:
a second type region having a relatively low density of spaced apart recesses formed therein with non-recessed areas therebetween, and
a third type region substantially free of recesses;

filling the pluralities of recesses with the electrically conductive material;

forming a blanket or overburden layer of the electrically conductive material of selectively varying thickness over the filled recesses and the non-recessed areas of the surface, the blanket or overburden layer selectively having a greater thickness at the relatively high recess density first type region than at the relatively low recess density second type region and/or the substantially recess-free third type region, the blanket or overburden layer including an exposed upper surface; and performing CMP of the exposed upper surface of the selectively varying thickness blanket or overburden layer to (a) substantially remove the portions thereof covering the non-recessed areas of the substrate surface and (b) render the exposed upper surface of the layer of electrically conductive material filling the recesses substantially coplanar with the non-recessed areas of the substrate surface, whereby non-planarity of the polished substrate surface due to increased surface erosion during CMP of the relatively high density, conductive material-filled recesses of the first type region is substantially reduced.

In embodiments according to the invention, the substrate comprises a semiconductor wafer having a dielectric layer formed thereon and comprising the surface, the recesses formed therein serving as electrical contact areas, vias, interlevel metallization, and/or interconnection routing of at least one active device region or component formed on or within the semiconductor wafer.

In further embodiments according to the invention, the relatively high recess density first type region comprises a first plurality of recesses having widths of about 0.8–2.0 $\mu$m, depths of about 0.3–2.5 $\mu$m, spacings of about 0.18–0.5 $\mu$m, the surface coverage of the first plurality of recesses is about 80–90%, the relatively low recess density second type region comprises a second plurality of recesses of similar widths but with spacings providing a surface coverage of less than about 80%, and the thickness of the selectively greater thickness region of the blanket or overburden layer is selected to compensate for non-planarity due to a concavity which would otherwise form in the surface at the first type region as a result of increased erosion of the first region during CMP.

In still further embodiments according to the invention, the semiconductor wafer substrate comprises monocrystalline silicon, the dielectric layer comprises an oxide, nitride, or oxynitride of silicon, the layer of electrically conductive material comprises a metal selected from copper, chromium, nickel, cobalt, gold, silver, aluminum, tungsten, titanium, tantalum, and alloys thereof, and is preferably copper or an alloy thereof.

In yet further embodiments according to the invention, the copper or copper alloy layer filling the recess is deposited by electroplating, and the selectively varying thickness blanket or overburden layer comprises copper or an alloy thereof deposited by electroplating from a conventional $CuSO_4$-based bath containing one or more conventional additives selected from triazoles, e.g., mercaptotriazoles; glycols, e.g., polyethylene glycols; and sulfonic acids, e.g., napthalene disulfonic acid, each present in conventional amount, e.g., as typically expressed in ppm. Given the disclosed objectives and guidance herein, other suitable additives and their respective operative concentrations can be readily determined.

In yet other embodiments according to the present invention, the substrate surface is provided with an adhesion promoting and/or diffusion barrier layer comprising chromium, tantalum, or tantalum nitride prior to filling the recesses with copper or copper alloy, and the CMP of the copper or copper alloy blanket or overburden layer is performed using an alumina-based slurry.

According to another aspect of the present invention, a method of manufacturing a semiconductor device comprises the sequential steps of:

providing a silicon semiconductor wafer comprising at least one active device region or component and having formed thereon a dielectric layer with an exposed upper surface comprising:
a first type region having a relatively high density of closely spaced apart recesses formed therein occupying about 80–90% of the surface area of the region, with non-recessed areas therebetween; and at least one of:
a second type region having a relatively low density of spaced apart recesses formed therein occupying less than about 80% of the surface area of the region, with non-recessed areas between, and
a third type region substantially free of recesses;

filling the pluralities of recesses with copper or copper alloy by electroplating;

forming, by electroplating, a selectively varying thickness blanket or overburden layer of copper or copper alloy over the filled recesses and the non-recessed areas of the surface, the blanket or overburden layer selectively having a greater thickness at the relatively higher recess density first type region than at the relatively low recess density second type region and/or the substantially recess-free third type region, the blanket or overburden layer including an exposed upper surface; and performing CMP of the exposed upper surface of the selectively varying thickness blanket or overburden layer to (a) substantially remove the portions thereof covering the non-recessed areas of the substrate surface and (b) render the exposed upper surfaces of the copper or copper alloy filling the recesses substantially coplanar with the non-recessed areas of the surface, whereby non-planarity of the polished surface due to increased surface erosion during CMP of the relatively high density of metal-filled recesses in the first type region is substantially reduced.

In embodiments according to the invention, the selectively varying electroplating step comprises DC, unipolar pulsed-DC, or reverse-polarity pulsed DC electroplating utilizing a conventional CuSO$_4$-based electroplating bath containing conventional electroplating additives in their usual amounts and providing the recessed and non-recessed areas of the substrate surface with an adhesion and/or barrier layer comprising chromium, tantalum, or tantalum nitride prior to filling the recesses with copper or copper alloy.

Additional advantages of the present invention will readily become apparent to those skilled in the art from the following detailed description, wherein only the preferred embodiment of the present invention is shown and described, simply by way of illustration of the best mode contemplated for carrying out the method of the present invention. As will be understood, the present invention is capable of other and different embodiments, and its several details are capable of modification in various obvious respects, all without departing from the present invention. Accordingly, the drawing and description are to be regarded as illustrative in nature, and not as limitative.

BRIEF DESCRIPTION OF THE DRAWINGS

The following detailed description of an embodiment of the present invention can best be understood when read in conjunction with the following drawings, wherein.

DESCRIPTION OF THE INVENTION

Figure 1:
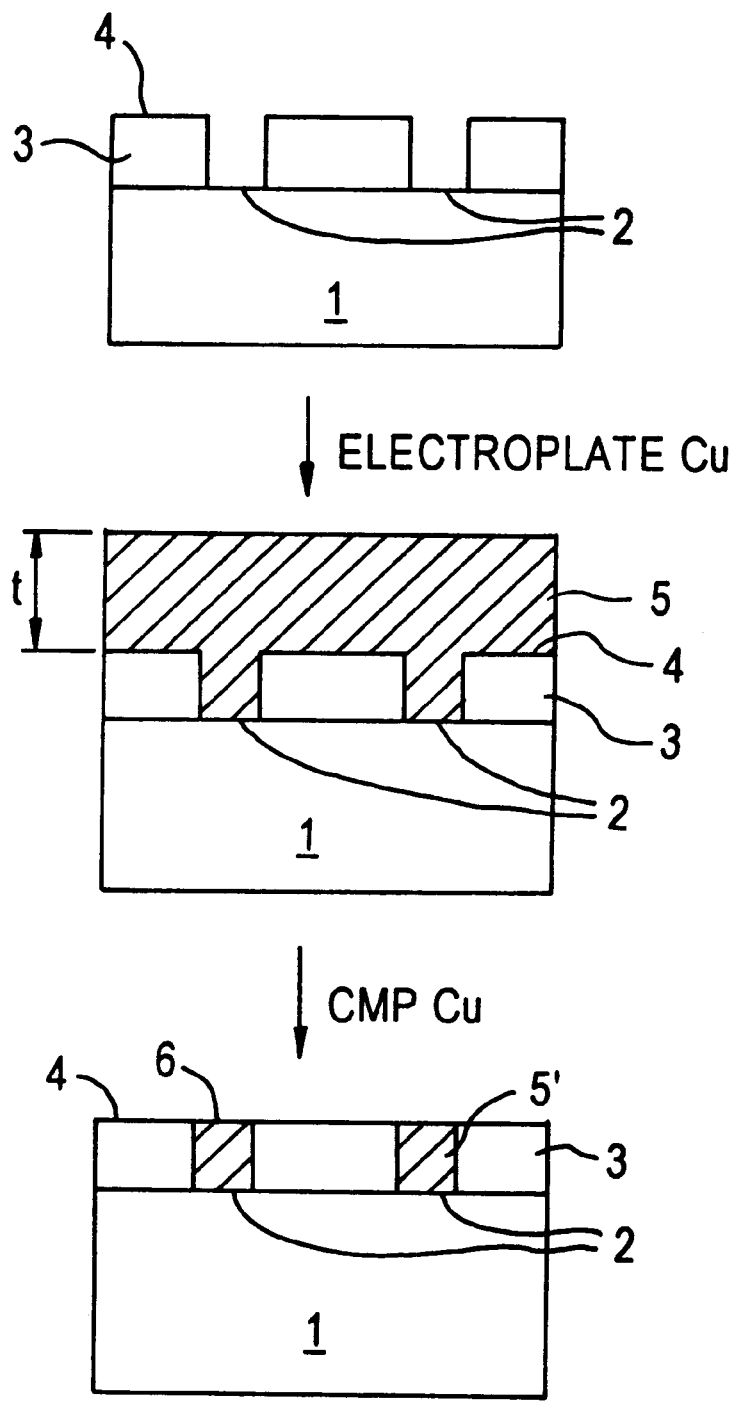
FIG. 1 illustrates, in simplified cross-sectional schematic form, the sequence of steps for performing a damascene-type electroplating and CMP type metallization process according to conventional practices.
Figure 2:
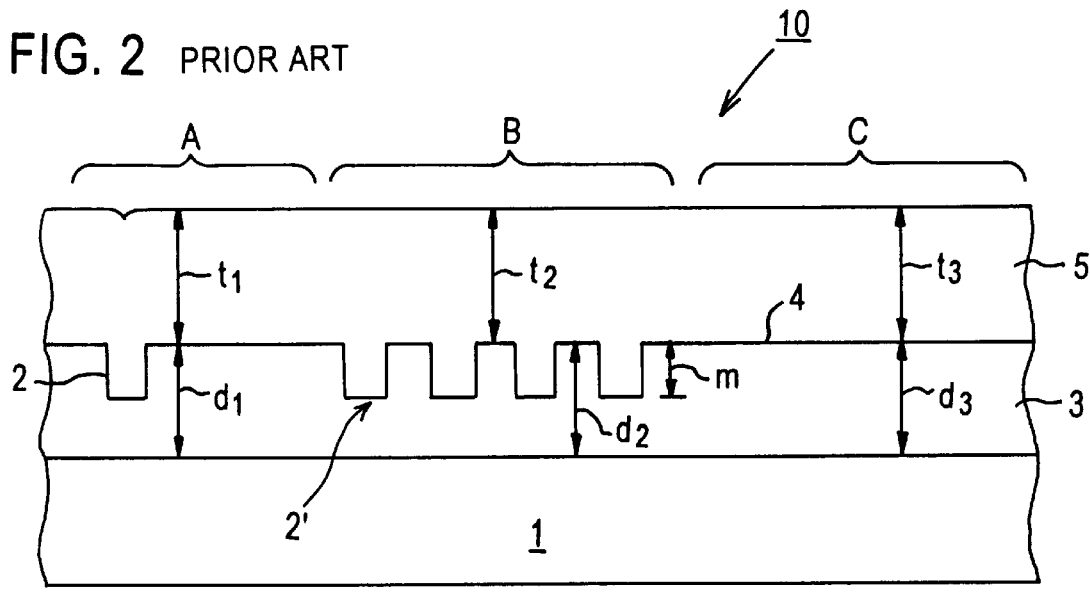
FIG. 2 illustrates, in simplified cross-sectional schematic view, an intermediate structure of conventional type used for fabricating a semiconductor device having a high metallization density region, prior to CMP processing for planarization of a surface thereof.
Figure 3:
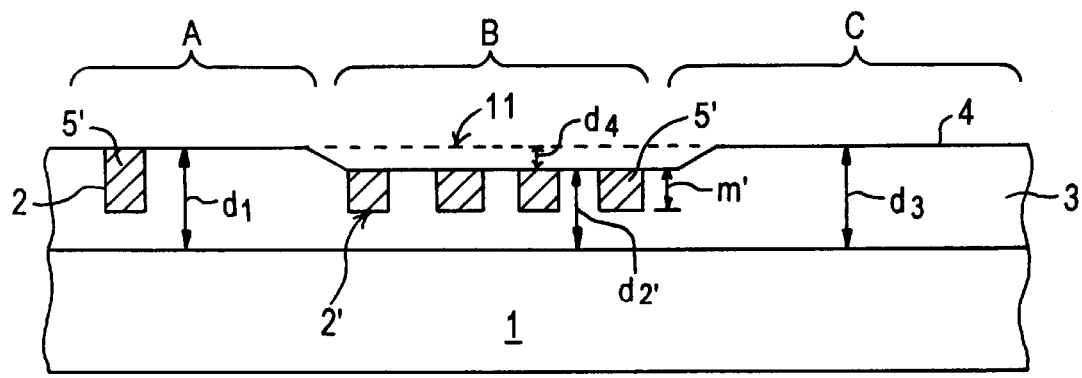
FIG. 3 illustrates, in simplified cross-sectional schematic view, the structure of FIG. 2 after CMP processing for planarization.
Figure 4:
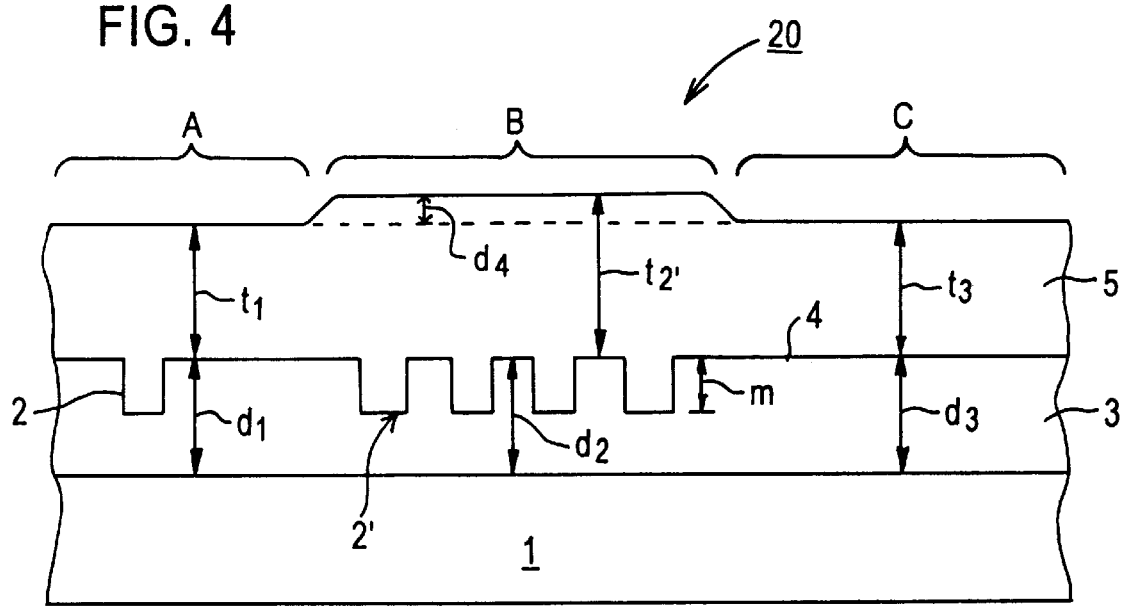
FIG. 4 illustrates, in simplified cross-sectional schematic view, an intermediate structure produced according to the method of the invention for fabricating a semiconductor device having a high metallization density region, prior to CMP processing for planarization of a surface thereof.

Referring now to FIG. 4, wherein like reference numerals are used to designate like features in FIGS. 1–3 and, hence, detailed description thereof will not be given, the present invention is based upon the recognition that formation of an intermediate structure 20 such as is shown in FIG. 4 can avoid the above-described drawback of increased erosion of high density metallization areas during CMP processing. Specifically, the inventive intermediate structure includes an electrically conductive blanket or overburden layer 5 (typically of one of the previously enumerated metals or an alloy thereof, e.g., copper or a copper-based alloy) of selectively increased thickness $t_2$, spanning the width of high density metallization region B. As illustrated, in order to compensate for the increased erosion of high density metallization patterns by CMP (FIG. 3), the thickness $t_1$ (or $t_3$) of overburden or blanket layer 5 is selectively increased (i.e., $t_2 = t_1$ and $d_4$) at such high metallization density areas or regions by an amount $d_4$ approximately equal to the depth $d_4$ of the concavity 11 that would otherwise form thereat as a result of conventional CMP processing. It should be emphasized that such equivalence of thickness is not an absolute requirement but rather a guideline for performing the process according to the invention. While in a typical damascene metallization process such as contemplated herein, the blanket or overburden layer thickness $d_4$ to be selectively added at high density metallization regions is from about 100 to about 2,000 Å, in most instances, the exact thickness will require determination according to the specific structure to be planarized and the specific CMP conditions.

The intermediate structure 20 of FIG. 4 may be fabricated by a variety of processes, including "wet" (e.g., electroplating, electroless plating, dipping, etc.) and "dry" (i.e. physical or chemical vapor deposition, etc.) techniques such as are known in the art. According to a first variant, a structure corresponding to the conventional intermediate structure 10 of FIG. 2 is formed, in a first step, according to conventional techniques, e.g., electroplating, electroless plating, sputtering, evaporation, chemical vapor deposition, etc., so as to include a generally constant thickness (i.e., $t_1 = t_2 = t_3$ of corresponding regions A, B, and C) metal overburden or blanket layer 5 presenting a generally planar upper, exposed surface. In a second step, high metallization density region B is subjected to selective deposition of a layer of the metal or alloy of e.g., thickness $d_4$ approximately equal to the depth of the concavity 11 that would otherwise form thereat.

Selective deposition in high density metallization region B may involve conventional photolithographic patterning/etching techniques for establishing a mask pattern having (an) opening(s) selectively located over high density metallization region(s) B, after which selective deposition and mask removal may be performed by any convenient technique, such as described above. However, a particularly preferred mask-less technique suitable for use with copper and/or copper-based alloys which combines simplicity with relatively rapid processing rates, comprises selectively electroplating high metallization density region B at a higher deposition rate than at lower density region A or at recess-free region C.

Such selectively increased copper electroplating may be achieved by DC, unipolar pulsed-DC, or reverse polarity pulsed DC electroplating utilizing a conventional CuSO$_4$-based electroplating bath (e.g., Enthone "M", available from Enthone OMI, New Haven, Conn.) and containing at least one conventional additive present in its (their) usual amount (s), i.e., as expressed in ppm. Such additives include, inter alia, triazoles, e.g., mercapto-ditriazole; glycols, e.g., polyethylene glycols; and sulfonic acids, e.g., napthalene disulfonic acid. Electrodeposition may be performed at a current density from about 15 mA/cm$^2$ to about 30 mA/cm$^2$, preferably about 22.5 mA/cm$^2$, at bath temperatures of about 15–30° C., preferably about 20° C. According to an embodiment of the present invention, an intermediate structure 10, such as that illustrated in FIG. 2, is initially formed by electroplating copper or copper alloy from a first bath not containing the electroplating additives, so as to fill the recesses 2, 2' and form the bulk of a generally constant thickness blanket or overburden layer 5 having a generally planar exposed upper surface, and then transferring the wafer workpiece to a second electroplating bath containing the electroplating additive(s) for completing deposition of layer 5 and for selectively depositing an additional thickness $d_4$ in high density metallization region B, thereby forming intermediate structure 20 shown in FIG. 4.

According to another alternative embodiment not requiring transfer of the wafer from a first electroplating bath to another, the formation of first intermediate structure 10 proceeds as before from an electroplating bath not containing the electroplating additive(s), and after a sufficient thickness of the copper or copper alloy blanket or overburden layer 5 has been deposited, the additive(s) is (are) added to the bath for formation of the second intermediate structure 20.

The exact mechanism by which the electroplating additive(s) function(s) to selectively provide thicker electroplated layers at regions of high metallization density is not known with certainty. However, and without being bound by any particular theory, it appears that the additive(s) selectively promote(s) nucleation of copper at underlying copper surfaces. Hence, copper electroplating occurs more rapidly at high metallization density areas vis-à-vis substrate areas containing a greater proportion of dielectric material. It is further believed that the other enumerated metals will be similarly selectively electroplated by means of use of the above-described additive(s) illustrated above in connection with copper and copper-based alloys.

Figure 5:
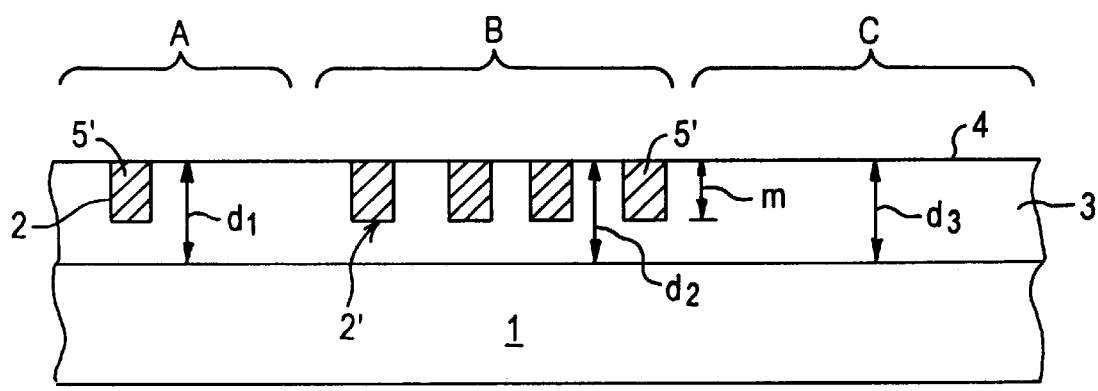
FIG. 5 illustrates, in simplified cross-sectional schematic view, the structure of FIG. 4 after CMP processing for planarization.

Referring now to FIG. 5, the intermediate structure 20 of FIG. 4 comprising a selectively deposited high density metallization area B is then subjected to CMP processing according to conventional technology. As is evident from FIG. 5, the selective provision of the additional thickness of copper or copper alloy blanket or overburden layer 5 results in a surface 4 of the dielectric layer 3 which is planar over its full extent (i.e., $d_1=d_2=d_3$), including that of high metallization density region B. As a further consequence of the inventive method, recessed metallization segments or features 5' of the high metallization density region B are of equal thickness m, which thickness corresponds to the required, or design, thickness.

A number of advantages are thus provided by the present invention, including, but not limited to, avoidance of non-planarity due to concavity formation in high density metallization regions; maintenance of adequate electrical conductivity of metallization features; maintenance of adequate dielectric isolation; greater planarity of metallization layers; and full compatibility with all aspects of conventional damascene-CMP process methodology.

In the previous descriptions, numerous specific details are set forth, such as particular materials, structures, reactants, processes, etc., in order to provide a thorough understanding of the present invention. However it should be recognized that the present invention can be practiced without resorting to the details specifically set forth. For example, the present invention is applicable to metallizing dual damascene openings as well as single damascene openings, and for circuit board manufacture. In other instances, well-known processing structures and techniques have not been described in detail in order not to unnecessarily obscure the present invention.

Only the preferred embodiments of the present invention are shown and described herein. It is to be understood that the present invention is capable of changes or modifications within the scope of the inventive concept as expressed herein.

What is claimed is:

1. A method of forming a layer of an electrically conductive material filling a plurality of closely spaced apart recesses formed in a substrate surface, said layer having an exposed upper surface substantially coplanar with said substrate surface, which method comprises the sequential steps of:

providing a substrate having a surface comprising:

a first region having a relatively high density of closely spaced apart recesses formed therein with non-recessed areas therebetween; and at least one of:

a second region having a relatively low density of spaced apart recesses formed therein with non-recessed areas therebetween, and a third region substantially free of recesses;

filling the pluralities of recesses with said electrically conductive material;

forming a blanket or overburden layer of said electrically conductive material of selectively varying thickness over the filled recesses and the non-recessed areas of said surface, said blanket or overburden layer selectively having a greater thickness at said relatively high recess density first region than at said relatively low recess density second region and/or said substantially recess-free third region, said blanket or overburden layer including an exposed upper surface; and chemical-mechanical polishing (CMP) said exposed upper surface of said selectively varying thickness blanket or overburden layer to: (a) substantially remove the portions thereof covering the non-recessed areas of the substrate surface and (b) render the exposed upper surfaces of the layer of electrically conductive material filling the recesses substantially coplanar with the non-recessed areas of the substrate surface, whereby non-planarity of the polished substrate surface due to increased surface erosion during CMP of the relatively high density conductive material-filled recesses of the first region is substantially reduced.

2. The method as in claim 1, comprising providing a semiconductor wafer substrate having a dielectric layer formed thereon and comprising said surface, said recesses formed therein serving as electrical contact areas, vias, interlevel metallization, and/or interconnection routing of at least one active device region or component formed on or within said semiconductor wafer.

3. The method as in claim 2, comprising providing a substrate wherein said relatively high recess density first region comprises a first plurality of recesses having widths of about 0.8–2.0 $\mu$m, depths of about 0.3–2.5 $\mu$m, spacings of about 0.18–0.5 $\mu$m, the surface coverage of said first plurality of recesses is about 80–90%, and the thickness of the selectively greater thickness region of the blanket or overburden layer is selected to compensate for non-planarity due to a concavity which would otherwise form in said surface at said first region as a result of increased erosion of the first region during chemical-mechanical polishing.

4. The method as in claim 3, comprising providing a substrate wherein said relatively low recess density second region comprises a second plurality of recesses of similar widths and depths as in said first region but with spacings providing a surface coverage of less than about 80%.

5. The method as in claim 4, wherein the semiconductor wafer substrate comprises monocrystalline silicon and said dielectric layer comprises an oxide, nitride, or oxynitride of silicon.

6. The method as in claim 2, wherein said layer of electrically conductive material comprises a metal selected from the group consisting of copper, chromium, nickel, cobalt, gold, silver, aluminum, tungsten, titanium, tantalum, and alloys thereof.

7. The method as in claim 6, wherein the metal is copper or an alloy thereof.

8. The method as in claim 7, comprising filling the recesses by electroplating said copper or copper alloy.

9. The method as in claim 8, comprising forming said selectively varying thickness blanket or overburden layer by electroplating said copper or copper alloy.

10. The method as in claim 9, comprising electroplating from a bath containing at least one additive for forming said selectively varying thickness blanket or overburden layer.

11. The method as in claim 10, wherein the bath is a $CuSO_4$-based copper or copper alloy electroplating bath.

12. The method as in claim 11, wherein the at least one additive is selected from triazoles, glycols, and sulfonic acids.

13. The method as in claim 8, comprising providing the substrate surface with an adhesion promoting and/or diffusion barrier layer prior to filling the recesses with copper or copper alloy.

14. The method as in claim 13, comprising providing said adhesion/barrier layer as a layer of chromium, tantalum, or tantalum nitride.

15. The method as in claim 7, comprising chemical-polishing said exposed upper surface of said copper or copper alloy blanket or overburden alloy using an alumina-based slurry.

16. A method of manufacturing a semiconductor device, which method comprises the sequential steps of:

providing a silicon semiconductor wafer comprising at least one active device region or component and having formed thereon a dielectric layer with an exposed upper surface comprising:

a first region having a relatively high density of closely spaced apart recesses formed therein occupying about 80–90% of the surface area of the region, with non-recessed areas therebetween; and at least one of:

a second region having a relatively low density of spaced apart recesses formed therein occupying less than about 80% of the surface area of the region, with non-recessed areas therebetween, and a third region substantially free of recesses;

filling the pluralities of recesses with copper or copper alloy by electroplating;

forming, by electroplating, a selectively varying thickness blanket or overburden layer of copper or copper alloy over the filled recesses and the non-recessed areas of said surface, said blanket or overburden layer selectively having a greater thickness at said relatively higher recess density first region than at said relatively low recess density second region and said substantially recess-free third region, said blanket or overburden layer including an exposed upper surface; and chemical-mechanical polishing (CMP) said exposed upper surface of said selectively varying thickness blanket or overburden layer to (a) substantially remove the portions thereof covering the non-recessed areas of the substrate surface and (b) render the exposed upper surfaces of said copper or copper alloy filling the recesses substantially coplanar with the non-recessed areas of the surface, whereby non-planarity of the polished surface due to increased surface erosion during CMP of the first, relatively high density metal-filled recesses of the first region is substantially reduced.

17. The method as in claim 16, comprising DC, unipolar pulsed-DC, or reverse polarity pulsed-DC electroplating said selectively varying thickness copper or copper alloy blanket or overburden layer from a $CuSO_4$-based electroplating bath containing at least one additive selected from triazoles, glycols, and sulfonic acids.

18. The method as in claim 16, comprising providing the recessed and non-recessed areas of said surface with an adhesion promoting and/or diffusion barrier layer prior to filling the recesses with copper or copper alloy.

19. The method as in claim 16, comprising providing said adhesion/barrier layer as a layer of chromium, tantalum, or tantalum nitride.

* * * * *